United States Patent

Van Lerberghe

[11] Patent Number: 6,151,221
[45] Date of Patent: Nov. 21, 2000

[54] PRINTED CIRCUIT BOARD HAVING WIRE CLAMPS FOR SECURING COMPONENT LEADS

[75] Inventor: Steven J. W. Van Lerberghe, Eindhoven, Netherlands

[73] Assignee: U.S. Philips Corporation, New York, N.Y.

[21] Appl. No.: 09/107,636

[22] Filed: Jun. 30, 1998

[30] Foreign Application Priority Data

Jul. 1, 1997 [EP] European Pat. Off. .............. 97401543

[51] Int. Cl.[7] .................................. H05K 7/02; H05K 1/18
[52] U.S. Cl. ...................... 361/774; 361/760; 361/772; 361/782; 361/807; 361/809; 361/811; 439/83; 439/860; 174/260
[58] Field of Search ................................. 174/138 G, 260, 174/267; 361/760, 767, 770, 771, 772, 773, 775, 776, 779, 782, 783, 807, 809, 808, 810, 811, 825, 517, 532, 533, 535, 538, 540, 774; 439/80, 81, 83, 860; 257/726, 727

[56] References Cited

U.S. PATENT DOCUMENTS

| | | | |
|---|---|---|---|
| 3,238,421 | 3/1966 | Patrick | 361/809 |
| 4,991,059 | 2/1991 | Kiyose | 361/773 |
| 5,548,482 | 8/1996 | Hatauchi et al. | 257/726 |
| 5,699,229 | 12/1997 | Brownell | 361/719 |
| 5,870,285 | 2/1999 | Kosteva et al. | 257/727 |

FOREIGN PATENT DOCUMENTS

| | | | |
|---|---|---|---|
| 2-166788 | 6/1990 | Japan | 439/83 |
| 4-352391 | 12/1992 | Japan . | |
| 6-84643 | 3/1994 | Japan | 336/65 |

*Primary Examiner*—Jeffrey Gaffin
*Assistant Examiner*—John B. Vigushin
*Attorney, Agent, or Firm*—Steven R. Biren

[57] ABSTRACT

A printed circuit board is provided with at least one component having one or more leads which are secured to contact faces of the printed circuit board. The leads of the component are secured to the printed circuit board via wire clamps soldered onto the surface of the contact faces. The formation of through-holes in the printed circuit board is rendered superfluous by the wire clamps. For the leaded components use can be made of resistors and capacitors, but also of a single electroconductive wire. Also described is a method of manufacturing the invented printed circuit board.

17 Claims, 1 Drawing Sheet

PRINTED CIRCUIT BOARD HAVING WIRE CLAMPS FOR SECURING COMPONENT LEADS

BACKGROUND OF THE INVENTION

This invention relates to a printed circuit board provided with at least one component having one or more leads which are secured to contact faces of the printed circuit board. The invention also relates to a method of mounting a component having one or more leads on a printed circuit board, at least one lead of the component being secured to the surface of a contact face of the printed circuit board.

Customary printed circuit boards comprise an electrically insulating substrate on which and/or in which a pattern of electroconductive tracks is provided. A number of these tracks terminate at a contact face situated at or on the surface of the printed circuit board. Electric components, such as resistors and capacitors, are secured to such contact faces by means of their terminals. In its most elementary form, such an electric component may consist of a single, electroconductive wire which is connected, for example, to an antenna or to another electric or electronic component which is connected to the printed circuit board via this wire. Resistors and capacitors generally comprise two or more terminals.

As regards the above-mentioned electric components, generally two embodiments are distinguished. Such components may take the form of leaded components or of leadless, surface-mountable components (SMD components). When leaded components are provided, the leads are customarily passed through the printed circuit board and subsequently secured to one or more contact faces of the printed circuit board by means of a soldered joint. To place SMD components on the printed circuit board, use is customarily made of a glued joint. Subsequently, the connection faces of the components are electrically connected to the contact faces of the printed circuit board by means of a wave-soldering treatment. The SMD embodiment of components is generally more expensive than the leaded embodiment.

Printed circuit boards are frequently provided with a plurality of surface-mountable components and one or a few leaded components. In this case, one or more through-holes are formed in the printed circuit board for the leaded components. In practice, it has been found that positioning and forming the necessary through-holes as well as individually securing the leads by soldering are operations which are very objectionable from the point of view of costs. This applies, in particular, if both leadless and leaded components must be provided on the PCB.

SUMMARY OF THE INVENTION

It is an object of the invention to provide a printed circuit board having one or more leaded components, in which the above-mentioned problem has been overcome. The invention more particularly aims at providing a printed circuit board having one or more leaded components which are not secured to the printed circuit board via through-holes. The invention also aims at providing a method of mounting one or more leaded components on a printed circuit board.

These and other objects of the invention are achieved by a printed circuit board provided with at least one component having one or more leads which are secured to contact faces of the printed circuit board, said printed circuit board in accordance with the invention being characterized in that the leads of the component are secured to the printed circuit board via wire clamps soldered onto the surface of the contact faces.

Through-holes for providing the leaded components are rendered superfluous by the use of wire clamps. Said wire clamps are electrically connected to the contact faces via a soldered joint. The leaded components are connected to these wire clamps in a clamping manner. It has been found that a drop of solder at the location where the lead of the component and the wire clamp are secured to each other causes the electric contact between these components to be substantially improved.

The invention also relates to a method of securing a component having one or more leads to a printed circuit board, at least one lead of the component being secured to the surface of a contact face of the printed circuit board. In accordance with the invention, this method is characterized in that the lead of the component is secured to the printed circuit board via a wire clamp soldered onto the surface of the contact face. The provision of through-holes in accordance with the known method is dispensed with in the method in accordance with the invention.

A preferred embodiment of the method in accordance with the invention is characterized in that the wire clamp is secured to the lead, whereafter said wire clamp is soldered onto the surface of the contact face. This soldering operation has to be carried out manually, preferably, after SMD components, if any, have been provided.

Another preferred embodiment of the method in accordance with the invention is characterized in that the wire clamp is soldered onto the surface of the contact face, whereafter the component is secured to the wire clamp via the lead. This embodiment has the advantage that soldering of the wire clamps and of SMD components, if any, can take place simultaneously. Securing the component with the lead or leads to the wire clamp(s) has to be performed manually at a later stage.

A further preferred embodiment of the method in accordance with the invention is characterized in that the wire clamp is secured to the contact face of the printed circuit board by means of a component placement machine and a wave soldering process. In comparison with manual placement methods, this method has the advantage that the rate and accuracy with which the wire clamps are placed on the printed circuit board is much greater.

BRIEF DESCRIPTION OF THE DRAWINGS

These and other aspects of the invention will be apparent from and elucidated with reference to the embodiments described hereinafter.

In the drawings.

DESCRIPTION OF THE PREFERRED EMBODIMENTS

Figure 1:
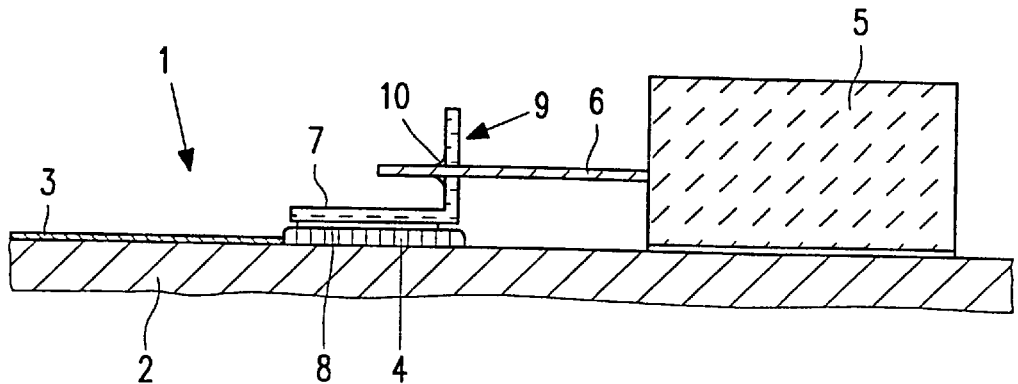
FIG. 1 shows a printed circuit board in accordance with the invention.

FIG. 1 is a schematic, cross-sectional view of a printed circuit board 1 comprising an electrically insulating substrate 2 (for example, of an epoxy resin) as well as an electroconductive track 3 of copper. A contact face 4, which in practice will be an expansion of track 3, is provided with a thin layer of tin and is situated at an end of track 3.

The substrate supports a leaded electric component 5 which, in this case, represents an electrolytic capacitor. This capacitor is provided with two leads, one of which, referenced 6, is shown. Both leads are secured via separate wire clamps to two individual contact faces of the printed circuit board. FIG. 1 only shows the connection between the lead 6 and the contact face 4 via the L-shaped wire clamp 7. A thin solder layer 8 is situated between the contact face 4 and the wire clamp 7.

In the manufacture of the printed circuit board in accordance with the invention, the wire clamp 7 and further SMD components, if any, are provided on the contact face 4 by means of an SMD-placement machine, and held in place by means of a drop of an adhesive (not shown). Subsequently, the printed circuit board is subjected to a wave-soldering treatment. In this treatment, the solder layer 8 is formed between the wire clamp 7 and the contact face 4. Finally, the component 5 is manually secured to the printed circuit board by tightly securing the lead 6 in the aperture 9 of the wire clamp 7. If the lead 6 is to be permanently secured, the aperture 9 can be provided with clamping members 10. Withdrawal of the component 5 causes these members to penetrate the lead 6 at the location of the aperture 9. Such a clamping member is commonly referred to as a "Chinese finger clamp".

Figure 2A:
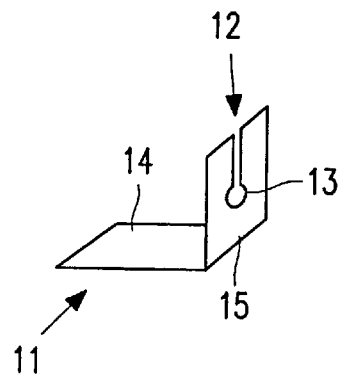
FIGS. 2a, 2b and 2c show a number of embodiments of wire clamps which can be used in the invention andit is noted that, for clarity, the Figures are not drawn to scale.
Figure 2B:
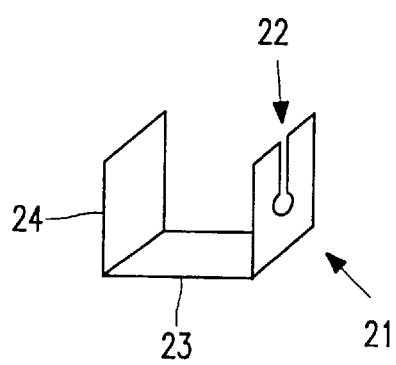
Figure 2C:
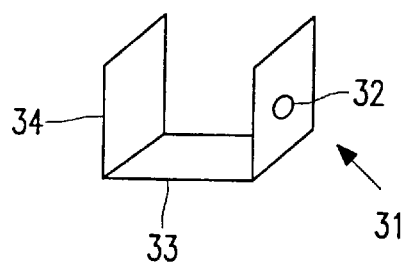

FIG. 2 shows three embodiments of wire clamps which can very successfully be used in the method in accordance with the invention. FIG. 2-a shows an L-shaped wire clamp 11 of a resilient, electroconductive material, such as a resilient metal alloy, for example, steel or copper. One of the two legs of the wire clamp is provided with a channel 12 having a slightly widened end portion 13. Preferably, the leg 14 is provided with a solderable layer, preferably of lead-tin solder, on the surface facing away from the leg 15.

The FIGS. 2-b and 2-c show two other, U-shaped wire clamps 21 and 31, respectively. One of the peripheral legs of both wire clamps is provided with a channel 22 having a widened end portion or a through-hole 32, respectively. The U-shaped wire clamps can be secured to a contact face of the printed circuit board in two ways, namely via the center face 23, 33, respectively, or via the leg 24, 34, respectively. In the first case, the axis of the lead will extend partly parallel to the printed circuit board. In the second case, the axis of the lead will extend approximately at right angles to the printed circuit board. The way in which the clamps are placed is governed, of course, by the intended layout of the printed circuit board.

The invention relates to a printed circuit board provided with at least one component having one or more leads which are secured to contact faces of the printed circuit board. In accordance with the invention, the leads of the component are secured to the printed circuit board via wire clamps soldered onto the surface of the contact faces. The formation of through-holes in the printed circuit board is rendered superfluous by said wire clamps. For the leaded components use can be made of resistors and capacitors, but also of a single electroconductive wire. The invention also provides a method of manufacturing the invented printed circuit board.

What is claimed is:

1. A printed circuit board provided with at least one component having one or more wire leads extending from the component which are secured to contact faces of the printed circuit board, wherein the leads of the component are secured to the printed circuit board via wire clamps soldered directly onto the surface of the contact faces.

2. The printed circuit board as claimed in claim 1 wherein the wire clamp comprises a resilient L-shaped member having on one face a narrow channel opening into a wider hole in which the wire lead of the one component is secured.

3. The printed circuit board as claimed in claim 1 wherein the wire clamp comprises a resilient U-shaped member having on one face a hole in which the wire lead of the one component is secured.

4. The printed circuit board as claimed in claim 1 wherein the one component is secured to the printed circuit board via at least one of said wire clamps and without the use of a through-hole in the printed circuit board.

5. A method of securing to a printed circuit board a component having one or more wire leads extending from the component, the method comprising:

securing at least one lead of the component to a wire clamp, and soldering the wire clamp directly onto the surface of a contact face of the printed circuit board thereby to secure said one lead of the component to the surface of said contact face via the wire clamp.

6. A method as claimed in claim 5, characterized by securing the wire clamp to the lead, and thereafter soldering said wire clamp onto the surface of the contact face.

7. A method as claimed in claim 5, characterized by soldering the wire clamp onto the surface of the contact face, and thereafter securing the component to the wire clamp via the lead.

8. A method as claimed in claim 7, characterized by securing the wire clamp to the contact face of the printed circuit board by means of a component placement machine and a wave-soldering process.

9. A printed circuit board comprising:

an electric insulating substrate, at least one electroconductive track on a surface of said substrate, said electroconductive track having a contact face for conduction of an electric current, at least one electric circuit component on the substrate and having one or more wire leads extending therefrom, at least one electroconductive wire clamp secured to one wire lead of the electric circuit component and secured to the contact face to provide a current path between the electric circuit component and the relevant electroconductive track of said contact face and by which the electric circuit component is secured to the surface of the substrate.

10. The printed circuit board as claimed in claim 9 wherein said electroconductive wire clamp is a thin resilient member soldered directly onto the surface of the contact face.

11. The printed circuit board as claimed in claim 9 wherein the insulating substrate is devoid of any through-holes.

12. The printed circuit as claimed in claim 9 wherein the electroconductive wire clamp comprises a resilient L-shaped member having on one face a narrow channel opening into a wider hole in which the wire lead of the electric circuit component is secured.

13. The printed circuit board as claimed in claim 12 further comprising a drop of solder securing the wire lead of the electric circuit component to an inner wall of the hole in said wire clamp.

14. The printed circuit board as claimed in claim 9 wherein the electroconductive wire clamp comprises a resilient U-shaped member having on one face a narrow channel opening into a wider hole in which the wire lead of the electric circuit component is secured.

15. The printed circuit board as claimed in claim 9 wherein the electroconductive wire clamp comprises a resilient U-shaped member having on one face a hole in which the wire lead of the electric circuit component is secured.

16. The printed circuit board as claimed in claim 9 further comprising a thin layer of solder between the contact face and a surface of the electroconductive wire clamp by which the electroconductive wire clamp is secured to said contact face.

17. The printed circuit board as claimed in claim 9 wherein the one electric circuit component is secured to the substrate of the printed circuit board via the one electroconductive wire clamp and without the provision of a through-hole in the substrate.

* * * * *